(12) United States Patent
Den Boef et al.

(10) Patent No.: US 9,506,743 B2
(45) Date of Patent: Nov. 29, 2016

(54) POSITION MEASURING APPARATUS, POSITION MEASURING METHOD, LITHOGRAPHIC APPARATUS AND DEVICE MANUFACTURING METHOD

(71) Applicants: ASML Netherlands B.V., Veldhoven (NL); ASML Holding N.V., Veldhoven (NL)

(72) Inventors: Arie Jeffrey Den Boef, Waalre (NL); Justin Lloyd Kreuzer, Trumbull, CT (US); Simon Gijsbert Josephus Mathijssen, Den Bosch (NL); Gerrit Johannes Nijmeijer, Larchmont, NY (US); J. Christian Swindal, Ridgefield, CT (US); Patricius Aloysius Jacobus Tinnemans, Hapert (NL); Richard Johannes Franciscus Van Haren, Waalre (NL)

(73) Assignees: ASML NETHERLANDS B.V., Veldhoven (NL); ASML HOLDING N.V., Veldhoven (NL)

( * ) Notice: Subject to any disclaimer, the term of this patent is extended or adjusted under 35 U.S.C. 154(b) by 0 days.

(21) Appl. No.: 14/427,287

(22) PCT Filed: Sep. 20, 2013

(86) PCT No.: PCT/EP2013/069540
§ 371 (c)(1),
(2) Date: Mar. 10, 2015

(87) PCT Pub. No.: WO2014/053334
PCT Pub. Date: Apr. 10, 2014

(65) Prior Publication Data
US 2015/0219438 A1 Aug. 6, 2015

Related U.S. Application Data

(60) Provisional application No. 61/709,042, filed on Oct. 2, 2012.

(51) Int. Cl.
*G06K 9/00* (2006.01)
*G01B 11/00* (2006.01)
(Continued)

(52) U.S. Cl.
CPC ......... *G01B 11/002* (2013.01); *G03F 7/70775* (2013.01); *G03F 9/7003* (2013.01); *G03F 9/7049* (2013.01); *G03F 9/7088* (2013.01); *H01L 22/12* (2013.01)

(58) Field of Classification Search
CPC ............... G03F 9/7003; G03F 9/7049; G03F 7/70775; G03F 9/708; H01L 22/12; G01B 11/002
USPC ......................................................... 382/144
See application file for complete search history.

(56) References Cited

U.S. PATENT DOCUMENTS

| 5,160,849 A | * | 11/1992 | Ota | ........................ | G03F 9/7049 250/548 |
| 5,204,535 A | | 4/1993 | Mizutani | | |

(Continued)

FOREIGN PATENT DOCUMENTS

| JP | H03-216519 | 9/1991 |
| JP | 2004-119663 | 4/2004 |

(Continued)

OTHER PUBLICATIONS

International Preliminary Report on Patentability mailed Apr. 16, 2015 in corresponding International Patent Application No. PCT/EP2013/069540.

(Continued)

*Primary Examiner* — Gregory F Cunningham
(74) *Attorney, Agent, or Firm* — Pillsbury Winthrop Shaw Pittman LLP (57) ABSTRACT

An apparatus to measure the position of a mark, the apparatus including an objective lens to direct radiation on a mark using radiation supplied by an illumination arrangement; an optical arrangement to receive radiation diffracted and specularly reflected by the mark, wherein the optical arrangement is configured to provide a first image and a second image, the first image being formed by coherently adding specularly reflected radiation and positive diffraction order radiation and the second image being formed by coherently adding specularly reflected radiation and negative diffraction order radiation; and a detection arrangement to detect variation in an intensity of radiation of the first and second images and to calculate a position of the mark in a direction of measurement therefrom.

15 Claims, 3 Drawing Sheets

(51) Int. Cl.
*G03F 9/00* (2006.01)
*G03F 7/20* (2006.01)
*H01L 21/66* (2006.01)

(56) References Cited

U.S. PATENT DOCUMENTS

| | | |
|---|---|---|
| 5,861,320 A | 1/1999 | Shiraishi |
| 6,961,116 B2 | 11/2005 | Den Boef et al. |
| 7,701,577 B2 | 4/2010 | Straaijer et al. |
| 7,791,727 B2 | 9/2010 | Den Boef et al. |
| 8,208,121 B2 | 6/2012 | Bijnen et al. |
| 2002/0025588 A1 | 2/2002 | Shiraishi |
| 2006/0033921 A1 | 2/2006 | Den Boef et al. |
| 2006/0197951 A1 | 9/2006 | Frommer et al. |
| 2008/0198380 A1 | 8/2008 | Straaijer et al. |
| 2009/0195768 A1 | 8/2009 | Bijnen et al. |

FOREIGN PATENT DOCUMENTS

| | | |
|---|---|---|
| JP | 2008-532320 | 8/2008 |
| JP | 2008-244448 | 10/2008 |

OTHER PUBLICATIONS

International Search Report mailed Mar. 27, 2014 in corresponding International Patent Application No. PCT/EP2013/069540.
Japanese Office Action mailed Jan. 13, 2016 in corresponding Japanese Patent Application No. 2015-533542.

\* cited by examiner

POSITION MEASURING APPARATUS, POSITION MEASURING METHOD, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2013/069540, which was filed on Sep. 20, 2013, which claims the benefit of priority of U.S. provisional application No. 61/709,042, which was filed on Oct. 2, 2012, and which is incorporated herein in its entirety by reference.

FIELD

The present invention relates to a position measuring apparatus and method, a lithographic apparatus and a method for manufacturing a device. The apparatus and method can be used to measure the position of a mark on a substrate.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, one or more alignment marks are generally provided on the substrate, and the lithographic apparatus includes one or more alignment sensors by which the position of a mark on a substrate may be accurately measured. The alignment sensor is effectively a position measuring apparatus. Different types of marks and different types of alignment sensors are known from different times and different manufacturers.

SUMMARY

A type of sensor used in a lithographic apparatus is based on a self-referencing interferometer. See, e.g., U.S. Pat. No. 6,961,116. Generally marks are measured separately to obtain X- and Y-positions. A combined X- and Y-measurement can be performed using a technique described in U.S. published patent application no. US 2009/195768. The contents of both of these patent documents are incorporated herein in their entirety by reference.

A potential drawback of alignment sensors, such as described above, is that when the position of a mark having a low optical contrast is to be measured, the signal strength of the diffraction radiation is relatively low. As a result, it may be challenging to measure the position with sufficient accuracy. Further, the measurement bandwidth, and thus measurement speed, may be limited.

It is desirable, for example, to provide an alignment sensor which is able to measure the position of a shallow mark with sufficient accuracy and with sufficient speed.

According to an embodiment of the invention, there is provided an apparatus to measure a position of a mark, the apparatus comprising:

an illumination arrangement configured to supply radiation with an illumination profile across a pupil of the apparatus;

an objective lens to direct radiation on a mark using radiation supplied by the illumination arrangement;

an optical arrangement configured to receive radiation that is diffracted and specularly reflected by the mark, wherein the optical arrangement is configured to provide a first image and a second image, the first image formed by coherently (or partially coherently) adding specularly reflected radiation and positive diffraction order radiation and the second image formed by coherently (or partially coherently) adding specularly reflected radiation and negative diffraction order radiation, wherein intensities or amplitudes of the positive and negative diffraction radiation are substantially equal to each other; and a detection arrangement configured to detect variation in an intensity of radiation of the first and second images and to calculate from the detected variation a position of the mark in at least a direction of measurement.

According to an embodiment of the invention, there is provided a method to measure a position of a mark, the mark comprising features periodic in at least a first direction, the method comprising:

illuminating the mark with radiation via an objective lens;

receiving specularly reflected radiation, positive diffraction order radiation and corresponding negative diffraction order radiation, wherein the orders of the positive diffraction order radiation and corresponding negative diffraction order radiation are substantially equal to each other;

forming a first image by coherently (or partially coherently) adding specularly reflected radiation to positive diffraction order radiation;

forming a second image by coherently (or partially coherently) adding specularly reflected radiation to negative diffraction order radiation;

detecting a variation in the intensity of radiation of the first and second images; and calculating the position of the mark from the detected variation.

According to an embodiment of the invention, there is provided a lithographic apparatus arranged to transfer a pattern from a patterning device onto a substrate, the apparatus comprising a substrate table constructed to hold a substrate and an alignment sensor configured to measure the position of a mark relative to a reference of the lithographic apparatus, wherein the alignment sensor comprises a measuring apparatus as described herein, and wherein the lithographic apparatus is arranged to control the transfer of a pattern onto the substrate by reference to the position of the mark measured using the measuring apparatus.

According to an embodiment of the invention, there is provided a method of manufacturing a device in which a lithographic process is used to transfer a pattern from a patterning device onto a substrate, wherein the transfer of a pattern onto the substrate is controlled by reference to a position of a mark measured using a method as described herein.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2, comprising FIG. 2(a) and FIG. 2(b), illustrates various forms of an alignment mark that may be provided on a substrate in the apparatus of FIG. 1;

DETAILED DESCRIPTION

Figure 1:
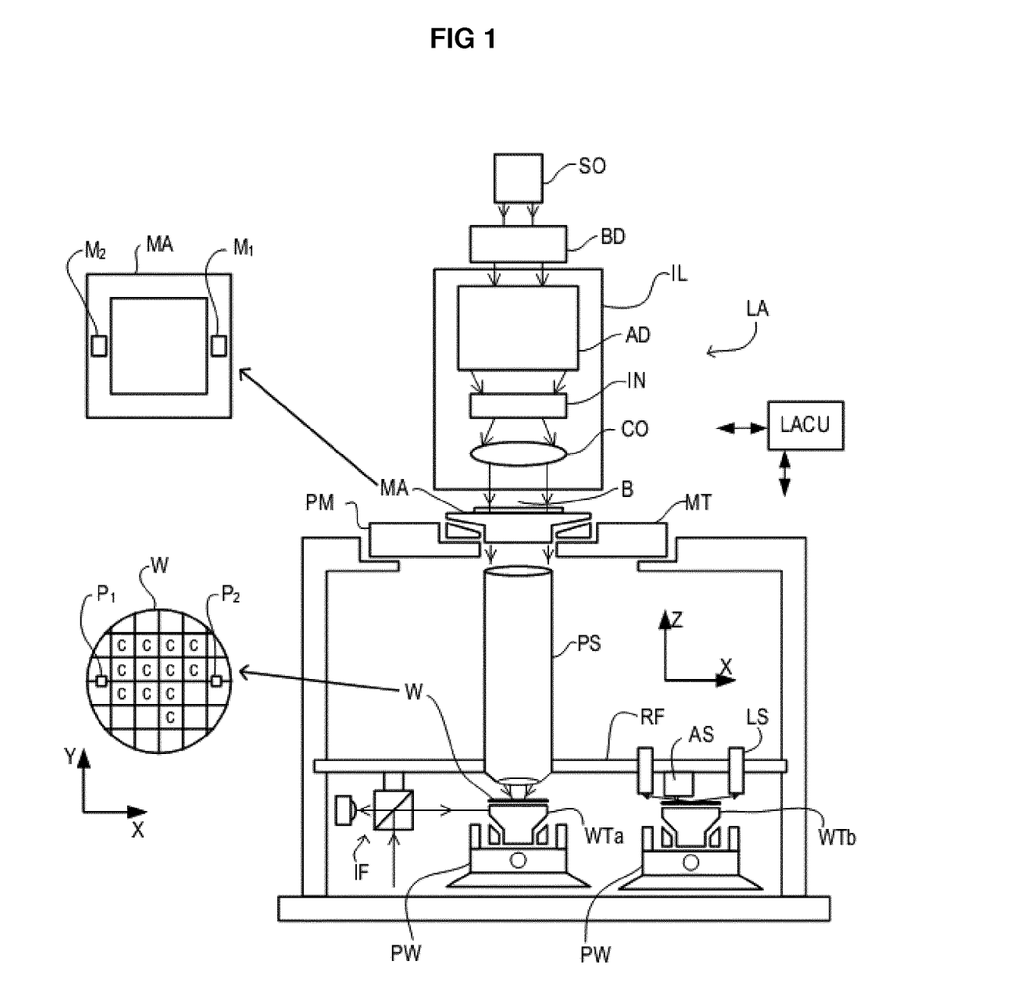
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device support structures). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. An embodiment of the invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa and WTb and two stations—an exposure station and a measurement station—between which the tables can be exchanged. In an embodiment, one or both of the tables WTa, WTb is/are a substrate table. In an embodiment, one table WTa, WTb is a substrate table and another table WTa, WTb is a measurement table comprising one or more sensors. In an embodiment, where both tables WTa, WTb are substrate tables, one substrate on one substrate table is being exposed at the exposure station while another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This can enable a substantial increase in the throughput of the apparatus. If the position sensor IF is not capable of measuring the position of a table while it is at the measurement station as well as at the exposure station, a second position sensor may be provided to enable the positions of the table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling, for example, real-time data acquisition, processing and control of a subsystem or component within the apparatus. For example, one processing subsystem may be dedicated to servo control of the positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
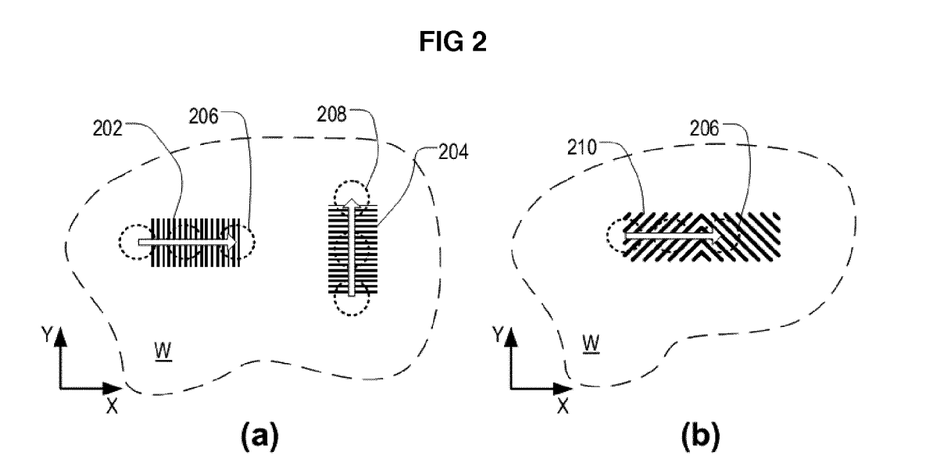

FIG. 2(a) shows examples of alignment marks 202, 204, provided on, e.g., a substrate W for the measurement of X-position and Y-position, respectively. Each mark in this example comprises a series of bars formed in a surface e.g., a product layer or other layer applied to or etched into the substrate. The bars are regularly spaced and act as grating lines so that the mark can be regarded as a diffraction grating with a well-known spatial period (pitch). The bars on the X-direction mark 202 are substantially parallel to the Y-axis to provide periodicity in the X-direction, while the bars of the Y-direction mark 204 are substantially parallel to the X-axis to provide periodicity in the Y-direction. The alignment sensor AS (e.g., as shown in FIG. 1) scans each mark optically with a spot 206, 208 of radiation, to obtain a periodically-varying signal, such as a sine wave. The phase of this signal is analyzed, to measure the position of the mark, and hence of, e.g., substrate W, relative to the alignment sensor, which in turn is substantially fixed relative to the reference frame RF of the apparatus. The scanning movement is indicated schematically by a broad arrow, with progressive positions of the spot 206 or 208 indicated in dotted outline. The pitch of the bars (grating lines) in the alignment pattern is typically much greater than the pitch of product features to be formed on the substrate, and the alignment sensor AS uses a wavelength of radiation (or usually plural wavelengths) much longer than the exposure radiation to be used for applying patterns to the substrate. Fine position information can be obtained, however, because the large number of bars allows the phase of a repeating signal to be accurately measured.

Coarse and fine marks may be provided, so that the alignment sensor can distinguish between different cycles of the periodic signal, as well as the exact position (phase) within a cycle. Marks of different pitches can also be used for this purpose. These techniques are known to the person skilled in the art, and will not be detailed herein.

FIG. 2(b) shows a modified mark for use with a similar alignment system in which X- and Y-positions can be obtained through a single optical scan with the illumination spot 206. The mark 210 has bars arranged at 45 degrees to both the X- and Y-axes.

Figure 3:
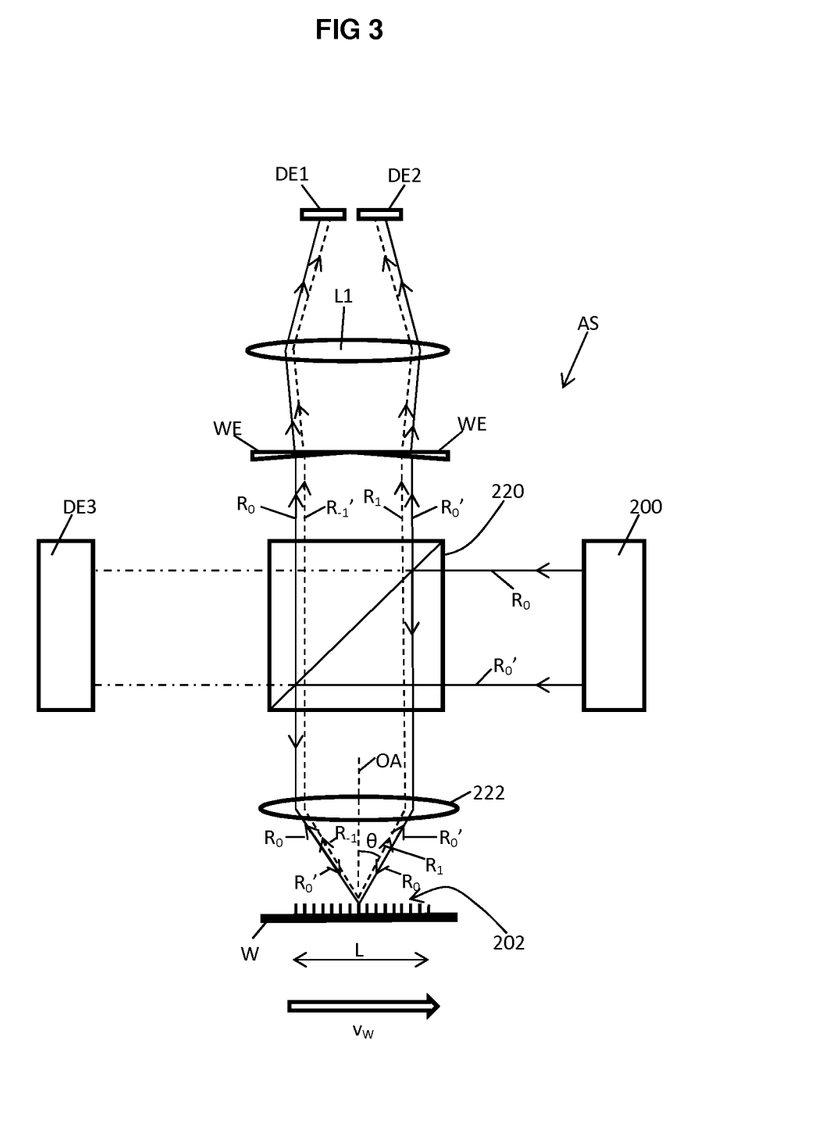
FIG. 3 is a schematic block diagram of an alignment sensor according to an embodiment of the invention scanning an alignment mark in the apparatus of FIG. 1.

FIG. 3 is a schematic block diagram of an alignment sensor AS according to an embodiment of the invention. An illumination arrangement 200 provides two beams $R_0$, $R_0'$ of radiation of one or more wavelengths, which are diverted by a beam splitter 220 through an objective lens 222 onto a mark, such as a mark 202, located on, e.g., substrate W. As indicated schematically in FIG. 2, in the example of the present alignment sensor, the illumination spots (206 in FIG. 2) by which the mark 202 is illuminated may be slightly smaller in diameter than the width of the mark itself.

A portion of the radiation beams $R_0$, $R_0'$ specularly reflects off the mark 202. The embodiment of FIG. 3 is configured in a symmetrical manner such that the specularly reflected radiation $R_0$ travels in the direction of the incident radiation $R_0'$, and that the specularly reflected radiation $R_0'$ travels in the direction of the incident radiation $R_0$ as indicated by the arrows and the corresponding reference signs between the objective lens and the substrate. The intensity of the two radiation beams $R_0$, $R_0'$ as provided by the illumination arrangement is desirably substantially equal to each other. In FIG. 3, the beams associated with the radiation beams $R_0$, $R_0'$ and the specular reflections thereof are indicated by solid lines.

The mark 202 will not only cause radiation to specularly reflect off the mark, but will also cause radiation from the radiation beams $R_0$, $R_0'$ to diffract off the mark. In FIG. 3 only two diffraction orders are shown, namely positive first diffraction order radiation of radiation beam $R_0$ indicated by reference sign $R_1$ and negative first diffraction order radiation of radiation beam $R_0'$ indicated by reference sign $R_{-1}'$. The beams associated with diffraction radiation are indicated by dashed lines in FIG. 3.

In FIG. 3, the positive first diffraction order radiation $R_1$ travels in the same direction as the specularly reflected radiation $R_0'$, thereby coherently (or partially coherently) adding specularly reflected radiation to the positive first diffraction order radiation, and thus optically amplifying the positive first diffraction order radiation.

The negative first diffraction order radiation $R_{-1}'$ travels in the same direction as the specularly reflected radiation $R_0$, thereby coherently (or partially coherently) adding specularly reflected radiation to the negative first diffraction order radiation, and thus optically amplifying the negative first diffraction order radiation.

This specific configuration of FIG. 3 in which a diffraction order associated with one radiation beam coincides with the specularly reflected radiation of the other beam can be achieved when the pitch of the mark, the wavelength of the illumination radiation, and angle of incidence are chosen in such a way that they satisfy the relation:

$$\lambda/P = 2*\sin(\theta)$$

where $\lambda$ represents the wavelength of the illumination radiation, P represents the pitch of the mark, and $\theta$ represents the angle between the incoming radiation beam $R_0$, $R_0'$ and the normal to the mark, which ideally is substantially parallel to the optical axis OA of the objective lens.

Although the embodiment of FIG. 3 relates to first diffraction order radiation, it will be apparent to the skilled person that the same principle of adding specularly reflected radiation to higher diffraction order radiation can also be used.

The combination of specularly reflected radiation $R_0$ and negative first diffraction order radiation $R_{-1}'$ forms a first image that is projected on a first detector element DE1 by lens element L1, and the combination of specularly reflected radiation $R_0'$ and positive first diffraction order radiation $R_1$ forms a second image that is projected on a second detector element DE2 by lens element L1. The wedge elements WE cause the first and second image to be spatially separated, so that they can be detected by their respective detector element. Spatially separating the first and second images may additionally or alternatively be caused by using one or more mirror elements. The intensities received by the first and second detector elements can be expressed as:

$$I_{DE1} = |R_0 + R_{-1}'|^2 = |R_0|^2 + |R_{-1}'|^2 + 2|R_{-1}'||R_0|\cos\left(\Phi - 2\pi\frac{x}{p}\right)$$

$$I_{DE2} = |R_0' + R_1|^2 = |R_0'|^2 + |R_1|^2 + 2|R_1||R_0|\cos\left(\Phi + 2\pi\frac{x}{p}\right)$$

where x represents the measurement direction, and $\Phi$ represents the phase difference between the specularly reflected radiation and the positive and negative first diffraction order radiation for x=0.

Using the detector elements DE1, DE2, detected variation in intensity of radiation of the first and second images can be used to calculate the position of the mark in at least a first direction of measurement, which is in this case substantially equal to the scanning direction of the spot 206. The calculations may be carried out in a separate processing unit (not shown in FIG. 3) or in the lithographic apparatus control unit of FIG. 1. The processing unit may be an integral part of the lithographic apparatus control unit.

The combination of optical elements which receive the radiation that is diffracted and specularly reflected by the mark, which in the embodiment of FIG. 3 are the objective lens 222, the beam splitter 220, the wedges WE and the optical element L1, may be referred to as the optical arrangement. The combination of detector elements configured to detecting variation in radiation intensity and the processing unit to calculate the position may be referred to as the detection arrangement.

The phase difference $\Phi$ between the specularly reflected radiation and the first diffraction order radiation is $\pi/2$ for a mark that is a shallow phase grating with low optical contrast.

Subtracting the two intensities, where $\Phi=\pi/2$, $|R_0|=|R_0'|$ and $|R_{-1}'|=|R_1|$, yields:

$$I_{DE1} - I_{DE2} = 4|R_1||R_0|\sin(\Phi)\sin\left(2\pi\frac{x}{P}\right) = 4|R_1||R_0|\sin\left(2\pi\frac{x}{P}\right)$$

Subtracting may be done by a subtracting device, which may be part of the processing unit or lithographic apparatus control unit. The position of the mark is then calculated from an output of the subtracting device.

For the mark being an amplitude grating, similar equations can be used. Due to the fact that for an amplitude grating no phase difference exists between the specularly reflected and diffracted radiation, one has to add, instead of subtract, the intensity signals of the detectors DE1 and DE2, yielding:

$$I_{DE1} + I_{DE2} = 2|R_0|^2 + 2|R_1|^2 + 4|R_1||R_0|\cos\left(2\pi\frac{x}{P}\right)$$

The above equations show an advantage of the apparatus according to the invention. For shallow and low optical contrast marks, the interesting position dependent signal has an amplitude proportional to $R_1$ and $R_0$ which results in a significant increase of the measurement signal, which is beneficial for detecting the measurement signal, certainly as $R_0$ is large compared to $R_1$ for shallow and low optical contrast gratings, compared to prior arrangements in which the measurement signal level may even scale with $|R_1|^2$.

In the case of the amplitude grating, the signal comprises some DC components, for instance from the specularly reflected radiation portions. These DC components may be removed by high-pass filtering or by measuring a signal representative for the intensity of the DC components. This signal can be measured using a third detector element DE3 which makes use of the property of the beam splitter 220 that a portion of the radiation coming from the illumination arrangement 200 is transmitted in the direction of the third detector element. The output of the third detector DE3 may be used to remove the DC component of the added intensity signals from the first and second detector DE1, DE2, in which case the position of the mark is calculated from an output of an adding device and from an output of the third detector.

Referring to the measurement process in more detail, an arrow labeled $v_w$ in FIG. 3 illustrates a scanning velocity with which spot 206 traverses the length L of mark 202. In this example, the alignment sensor AS and spot 206 in reality remains stationary, while it is the substrate W that moves with velocity $v_w$. The alignment sensor can thus be mounted rigidly and accurately to the reference frame RF (FIG. 1), while effectively scanning the mark 202 in a direction opposite to the direction of movement of substrate W. The substrate is controlled in this movement by its mounting on the substrate table WT and the positioning system PW.

Figure 4:
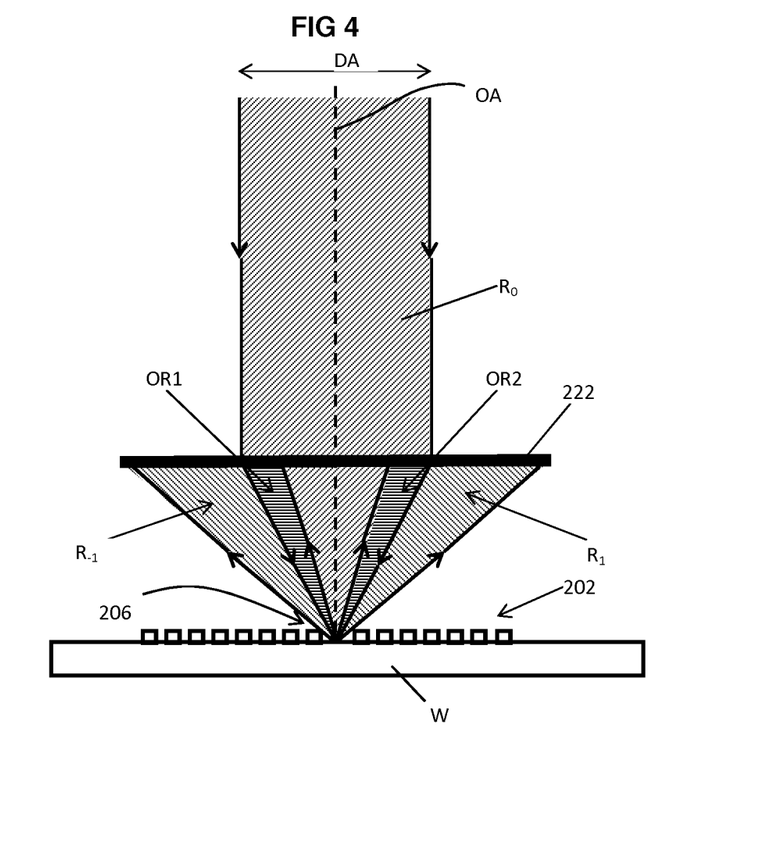
FIG. 4 depicts a portion of an alignment sensor according to an embodiment of the invention.

FIG. 4 depicts a portion of an apparatus according to a further embodiment of the invention. Where the embodiment of FIG. 3 uses an off-axis illumination profile with two radiation beams and corresponding spots, it is also possible to use a single radiation beam having an on-axis illumination profile as shown in FIG. 4. Shown is a mark 202 on, e.g., substrate W, and an objective lens 222 which is schematically depicted as a solid line and which is similar in function to the objective lens of FIG. 2. Provided to the objective lens is a radiation beam $R_0$ having a diameter DA. The radiation beam $R_0$ is projected to form a spot 206 on the mark 202. The projection causes the radiation beam to have a cone shape between the objective lens and the substrate. Due to the symmetric shape of the radiation beam $R_0$ about an optical axis OA of the objective lens 222 and the fact that the optical axis is substantially normal to the mark 202, the specularly reflected radiation follows the reverse optical path of the incoming radiation beam $R_0$. Hence, the specularly reflected radiation also has a cone shape in between the substrate and the objective lens.

The mark also diffracts the radiation beam. Shown in FIG. 4 are the positive first diffraction order radiation and the negative first diffraction order radiation, respectively referred to as $R_1$ and $R_{-1}$. Because the radiation beam incident to the mark has a cone shape, the first diffraction order radiation beams also have a cone shape. The illumination profile is wide enough, i.e. diameter DA is large enough, so that the cone of the specularly reflected radiation and the cone of the positive first diffraction order radiation overlap as indicated by area OR2, and so that the cone of the specularly reflected radiation and the cone of the negative first diffraction order radiation overlap as indicated by area OR1. The overlapping areas can subsequently be used to form the first and second images which can be processed as described above. Alternatively, the overlap of the specularly reflected radiation cone with the zeroth order diffraction radiation cone might be used as the second image.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An apparatus to measure a position of a mark, the apparatus comprising:
    an objective lens configured to direct radiation on a mark;
    an optical arrangement configured to receive radiation that is diffracted and specularly reflected by the mark, wherein the optical arrangement is configured to provide a first image and a second image, the first image formed by coherently adding specularly reflected radiation and positive diffraction order radiation and the second image formed by coherently adding specularly reflected radiation and negative diffraction order radiation, wherein intensities or amplitudes of the positive and negative diffraction order radiation are substantially equal to each other; and
    a detection arrangement configured to detect variation in an intensity of radiation of the first and second images and to calculate from the detected variation a position of the mark in a direction of measurement, wherein the calculated position is a function of the combination of the intensity of the radiation of the first and second images.

2. The apparatus according to claim 1, wherein the first image is formed by coherently adding specularly reflected radiation and positive first diffraction order radiation, and wherein the second image is formed by coherently adding specularly reflected radiation and negative first diffraction order radiation.

3. The apparatus according to claim 1, wherein the mark is a phase grating, wherein the detection arrangement comprises a first detector to detect the intensity of radiation of the first image, a second detector to detect the intensity of radiation of the second image, and a subtracting device to subtract an output from the first detector from an output of the second detector, and wherein the detection arrangement is configured to calculate a position of the mark in the direction of measurement from an output of the subtracting device.

4. The apparatus according to claim 1, wherein the mark is an amplitude grating, wherein the detection arrangement comprises a first detector to detect the intensity of radiation of the first image, a second detector to detect the intensity of radiation of the second image, and an adding device to add an output from the first detector to an output of the second detector, wherein the detection arrangement further comprises a third detector to detect an intensity of radiation used to form the first and second specularly reflected radiation, and wherein the detection arrangement is configured to calculate a position of the mark in the first direction of measurement from an output of the adding device and from an output of the third detector.

5. The apparatus according to claim 1, further comprising an illumination arrangement configured to supply radiation to the objective lens and wherein the illumination arrangement and the objective lens are configured to provide an on-axis illumination profile wide enough to cause a specularly reflected radiation cone to overlap with respective cones of first order diffraction radiation.

6. The apparatus according to claim 1, further comprising an illumination arrangement configured to supply radiation to the objective lens and wherein the illumination arrangement and the objective lens are configured to provide an off-axis illumination profile with two spots of radiation formed on the mark, wherein specularly reflected radiation of one spot is coherently added to first order diffraction radiation of the other spot to form the first image, and wherein specularly reflected radiation of the other spot is coherently added to first order diffraction radiation of the one spot to form the second image.

7. A method of measuring a position of a mark, the mark comprising features periodic in at least a first direction, the method comprising:
    illuminating the mark with radiation via an objective lens;
    receiving specularly reflected radiation, positive diffraction order radiation and negative diffraction order radiation, wherein intensities or amplitudes of the positive diffraction order radiation and negative diffraction order radiation are substantially equal to each other;
    forming a first image by coherently adding specularly reflected radiation to positive diffraction order radiation;
    forming a second image by coherently adding specularly reflected radiation to negative diffraction order radiation;
    detecting a variation in the intensity of radiation of the first and second images;
    and calculating the position of the mark from the detected variation, wherein the calculated position is a function of the combination of the intensity of the radiation of the first and second images.

8. The method according to claim 7, wherein the specularly reflected radiation, positive diffraction order radiation and negative diffraction order radiation are received via the objective lens.

9. The method according to claim 7, wherein the first image is formed by coherently adding specularly reflected radiation to positive first diffraction order radiation, and wherein the second image is formed by coherently adding specularly reflected radiation to negative first diffraction order radiation.

10. The method according to claim 7, wherein the mark is illuminated by two spots of radiation via the objective lens using an off-axis illumination profile, wherein specularly reflected radiation of one spot is coherently added to first order diffraction radiation of the other spot to form the first image, and wherein specularly reflected radiation of the other spot is coherently added to first order diffraction radiation of the one spot to form the second image.

11. The method according to claim 7, wherein the mark is a phase grating, wherein calculating the position of the mark from the detected variation comprises determining the difference between the detected variation in the intensity of radiation of the first image and the detected variation in the intensity of radiation of the second image, and calculating the position of the mark based on the determined difference.

12. The method according to claim 7, wherein the mark is an amplitude grating, wherein the method further comprises determining the intensity of radiation used to form the specularly reflected radiation, and wherein calculating the position of the mark comprises adding the variation in the intensity of radiation of the first and second images together, removing the contribution of the specularly reflected radiation to the added variation based on the determined intensity of the radiation used to form the first and second specularly reflected radiation, and calculating the position of the mark based on the added variation after removal of the contribution of the specularly reflected radiation.

13. The method according to claim 7, wherein the mark is illuminated with a spot of radiation using an on-axis illumination profile, wherein the illumination profile is wide enough such that the first image is formed by overlapping a specularly reflected radiation cone with a positive first diffraction order radiation cone and such that the second image is formed by overlapping the specularly reflected radiation cone with a negative first diffraction order radiation cone.

14. A lithographic apparatus arranged to transfer a pattern from a patterning device onto a substrate, the apparatus comprising a substrate table constructed to hold a substrate and an alignment sensor configured to measure the position of a mark relative to a reference of the lithographic apparatus, wherein the alignment sensor comprises the apparatus to measure a position of the mark as claimed in claim 1 and wherein the lithographic apparatus is arranged to control the transfer of a pattern onto the substrate by reference to the position of the mark measured using the apparatus to measure the position of the mark.

15. A method of manufacturing a device in which a lithographic process is used to transfer a pattern from a patterning device onto a substrate, and wherein the transfer of a pattern onto the substrate is controlled by reference to a position of a mark measured using the method as claimed in claim 7.

* * * * *